United States Patent
Su et al.

(10) Patent No.: US 6,365,455 B1
(45) Date of Patent: Apr. 2, 2002

(54) FLASH MEMORY PROCESS USING POLYSILICON SPACERS

(75) Inventors: Wen-Doe Su, Hsinchu; Thomas Chang, Taichung; Kuo-Tung Sung, Hsinchu; Mao Song Tseng, Hsinchu; Shih-Chi Lai, Hsinchu; Kun-Yu Sung, Hsinchu; Liang-Chen Lin, Hsinchu, all of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/092,241

(22) Filed: Jun. 5, 1998

(51) Int. Cl.⁷ .............................. H01L 21/336
(52) U.S. Cl. .................. 438/257; 438/261; 438/265; 438/304; 438/591; 438/595
(58) Field of Search ................. 438/595, 596, 438/265, 267, 304, 257, 261, 277, 303, 591, 588

(56) References Cited

U.S. PATENT DOCUMENTS

| | | | |
|---|---|---|---|
| 5,066,992 A | | 11/1991 | Wu et al. |
| 5,073,513 A | * | 12/1991 | Lee .............................. 438/267 |
| 5,268,585 A | * | 12/1993 | Yamauchi .................... 257/316 |
| 5,413,948 A | * | 5/1995 | Pfiester et al. .............. 438/152 |
| 5,440,159 A | | 8/1995 | Larsen |
| 5,493,534 A | | 2/1996 | Mok |
| 5,496,750 A | * | 3/1996 | Moslehi ....................... 438/297 |
| 5,587,951 A | | 12/1996 | Jazayeri et al. |
| 5,606,532 A | | 2/1997 | Lambrache et al. |
| 5,648,287 A | * | 7/1997 | Tsai et al. .................... 438/305 |
| 5,680,346 A | | 10/1997 | Pathak et al. |
| 5,736,466 A | * | 4/1998 | Wu .............................. 438/302 |
| 5,915,182 A | * | 6/1999 | Wu .............................. 438/299 |
| 5,930,617 A | * | 7/1999 | Wu .............................. 438/233 |

\* cited by examiner

Primary Examiner—Eddie Lee
Assistant Examiner—Nidra Richards
(74) Attorney, Agent, or Firm—Townsend and Townsend and Crew, LLP

(57) ABSTRACT

An EPROM cell and a method that includes a gate structure having a sidewall spacer. The sidewall spacer is made by way of an amorphous or polycrystalline silicon layer, which is converted into an insulating layer such as silicon dioxide. Deposition of the amorphous or polycrystalline silicon layer is more accurate and produces a more uniform layer than conventional dielectric layer deposition.

15 Claims, 7 Drawing Sheets

FLASH MEMORY PROCESS USING POLYSILICON SPACERS

BACKGROUND OF THE INVENTION

The present invention relates to the field of semiconductor electronic devices and a method for manufacturing the same. More particularly, the present invention relates to a process suited for manufacturing erasable programmable read-only memory cells.

Erasable programmable read-only memory ("EPROM") technology is known for use in both memory and programmable logic applications. In particular, EPROMs are implemented using floating gate field effect transistors in which the binary states of the EPROM cell are represented by the presence or absence of sufficient charge on the floating gate to prevent conduction even when a normal high signal is applied to the gate of the EPROM transistor.

In the traditional and most basic form, EPROMs are programmed electrically and erased by exposure to ultraviolet light and are typically referred to as ultraviolet erasable programmable read-only memories ("UVEPROM"'s). As seen in FIG. 1, a UVEPROM cell 10 typically includes two polysilicon gates disposed above a P-doped substrate 12 having a pair of spaced-apart N-doped active regions 14 and 16 defining a channel region 18 therebetween. The two polysilicon gates are disposed above the channel region 18 with the opposing ends of each of the polysilicon gates overlapping one of the active regions 14 and 16. One gate is disposed between the remaining gate and the substrate 12, defining a floating gate 20. The remaining gate is spaced apart from the floating gate 20 and defines a control gate 22. The floating gate 20 is embedded in an oxide 24 which facilitates capacitive coupling to both the control gate 22 and the substrate 12.

A UVEPROM cell is programmed by running a high current between the active regions 14 and 16 while applying a positive potential to the control gate 22. This is typically achieved by grounding one of the active regions, such as the source 14, while applying the positive potential to both the control gate 22 and the remaining active region, the drain 16. In this fashion, electrons in the substrate 12 obtain sufficient energy to overcome the 3.2 eV energy barrier at the interface between the silicon substrate and the silicon dioxide. This phenomenon is typically called electron injection. The positive voltage on the floating gate 20 causes the electrons to collect thereon. The cell 10 is erased by internal photo emission of electrons from the floating gate 20 to the control gate 22 and the substrate 12. Ultraviolet light increases the energy of the floating gate electron to a level where they jump the 3.2 eV energy barrier and return to the substrate 12.

Another form of EPROM is the electrically erasable programmable read-only memory ("EEPROM or $E^2$PROM"). EEPROMs generally include two serially connected N-channel metal oxide semiconductor transistors in which one of the transistors has an additional gate that is floating and is sandwiched between a control gate and a channel. This floating gate is used to store positive or negative charges which determine the state of the EEPROM. The other transistor is used for selection purposes. The electrons transfer between the floating gate and the drain by Fowler-Nordheim tunneling. This is a quantum mechanical phenomenon that allows electrons to pass through the aforementioned silicon substrate-silicon dioxide interface at an energy below 3.2 eV. Programming of the cell is achieved by tunneling from the floating gate to the drain, leaving the floating gate relatively more positively charged. In the erase mode, the control gate is at a high voltage and the drain is grounded. A drawback with Fowler-Nordheim tunneling is that it often results in over-erasure of the EEPROM cell which tends to leave the floating gate positively charged.

To overcome the over-erasure problem associated with Fowler-Nordheim tunneling, a split gate EPROM cell 26, shown in FIG. 2, was developed. The split gate cell 26 merges the control gate 28 with the floating gate 30 over the channel 32. The split gate cell 26 is characterized by the control gate 28 having a first conductive region 34 that extends parallel to both the channel 32 and the floating gate 30 and a second region 36 that extends from the first conductive region 34, transversely thereto toward the channel 32. The second conductive region 36 prevents the cell from "turning-on" as a result of positive charge on the floating gate 30. As before, the floating gate is embedded in an oxide layer 38 so as to be capacitively coupled to both the control gate 28 and the channel region 32.

A problem encountered with the manufacture of EPROMs concerned irregularities in the width of the oxide layer or spacer. Specifically, areas of the oxide layer are formed so that they are relatively thin due to sharp needle-like protrusions that extend from the surface of the polysilicon gate into the thermal oxide. This results from oxidation progressing faster along certain crystal directions. Electric fields concentrate at the tips of these protrusions which support enhanced localized conduction as much as an order of magnitude greater than in protrusion-free silicon surfaces.

Recent trends in EPROM design have employed thermal techniques to control the size and shape of these protrusions. In this fashion, silicon oxide layers having a greater over-all thickness may be employed while still providing Fowler-Nordheim tunneling. However, controlling the size and shape of these protrusions is particularly problematic with the split gate cell design as it may cause shorting between the gates, in a worse case, and can make charge retention in the floating gate problematic. These protrusions may cause premature erasing of the cell in the most harmless case.

What is needed, therefore, is an EPROM cell and method for manufacturing the same, which allows precise control of the thickness of dielectric oxide layers positioned on the floating gate.

SUMMARY OF THE INVENTION

According to the present invention, a technique including a method and structure for a semiconductor integrated circuit device is provided. In an exemplary embodiment, the present invention provides a novel technique for manufacturing sidewall spacers for a flash memory cell. The technique is relatively easy to use and provides a high degree of accuracy.

In a specific embodiment, the present invention provides a method of forming an electrically programmable read-only memory ("EPROM") cell. The method includes a step of providing a substrate having a dielectric layer thereon (e.g., tunnel oxide, tunnel oxynitride, tunnel nitride), and forming a gate electrode having edges overlying the dielectric layer. The gate electrode can have a nitride cap layer thereon. In most embodiments, the gate electrode and nitride cap layer are made by way of masking and etching processes. The gate electrode can have substantially vertical edges, but is not limited to such vertical edges. A first oxide layer is formed overlying the nitride cap layer and edges of the gate electrode to isolate and insulate the gate electrode. The first oxide layer can be made using a variety of techniques such as thermal or steam oxidation, chemical vapor deposition, and the like. An amorphous silicon layer is formed overlying the oxide layer to a selected thickness. To form amorphous silicon, a chemical vapor deposition technique at low temperature is used. Chemical vapor deposition forms a highly uniform amorphous silicon layer, which has a uniformity ranging from about ±12% about ±15%. The amorphous silicon can be undoped or doped, depending upon the application. In some embodiments, the silicon layer is not amorphous but is polycrystalline silicon, which is highly uniform.

A second oxide layer is formed overlying the amorphous silicon layer by way of, for example, a thermal oxidation technique, but can be others. The present method forms sidewall spacers on the edges of the gate electrode from at least the thickness of the amorphous silicon layer, and in some cases a portion of the thickness of the second oxide layer. Sidewall spacers can be formed using a variety of techniques such as, for example, anisotropic etching or combinations of other etching techniques. In some embodiments, the thickness of the amorphous silicon is converted into a dielectric layer comprising silicon. This dielectric layer is an insulating layer, which isolates, insulates, and seals the gate electrode from overlying integrated circuit elements.

In an alternative specific embodiment, the present invention provides an electrically programmable read-only memory ("EPROM") cell. The present cell includes a substrate having a dielectric layer thereon (e.g., tunnel oxide, tunnel oxynitride, tunnel nitride), and a gate electrode having edges overlying the dielectric layer. The gate electrode can have a nitride cap layer thereon. In most embodiments, the gate electrode and nitride cap layer are made by way of masking and etching processes. The gate electrode can have substantially vertical edges, but is not limited to such vertical edges. A first oxide layer is overlying the nitride cap layer and edges of the gate electrode to isolate and insulate the gate electrode. The first oxide layer can be made using a variety of techniques such as thermal or steam oxidation, chemical vapor deposition, and the like. An amorphous silicon layer is overlying the oxide layer to a selected thickness. To form amorphous silicon, a chemical vapor deposition technique at low temperature is used. Chemical vapor deposition forms a highly uniform amorphous silicon layer, which has a uniformity ranging from about ±2% to about ±5%. The amorphous silicon can be undoped or doped, depending upon the application. In some embodiments, the silicon layer is not amorphous but is polycrystalline silicon, which is highly uniform.

A second oxide layer is overlying the amorphous silicon layer and can be formed from, for example, a thermal oxidation technique, but can be others. The sidewall spacers on the edges of the gate electrode are at least the thickness of the amorphous silicon layer, and in some cases a portion of the thickness of the second oxide layer. Sidewall spacers can be formed using a variety of techniques such as, for example, anisotropic etching or combinations of other etching techniques. In some embodiments, the thickness of the amorphous silicon is converted into a dielectric layer comprising silicon. This dielectric layer is an insulating layer, which isolates, insulates, and seals the gate electrode from overlying integrated circuit elements.

Numerous benefits are achieved over pre-existing techniques. In particular, the present invention uses a highly accurate chemical vapor deposition technique for forming sidewall spacers made of amorphous silicon or polycrystalline silicon. The spacers are converted using a thermal process (e.g., annealing) to change the silicon into silicon dioxide, which is an insulating layer. By way of the silicon spacer, the present invention provides a more uniform spacer, than conventional techniques. These and other benefits are described throughout the present specification, but more particularly below.

The present invention achieves these benefits in the context of known process technology. However, a further understanding of the nature and advantages of the present invention may be realized by reference to the latter portions of the specification and attached drawings.

DETAILED DESCRIPTION OF THE SPECIFIC EMBODIMENTS

Figure 1:
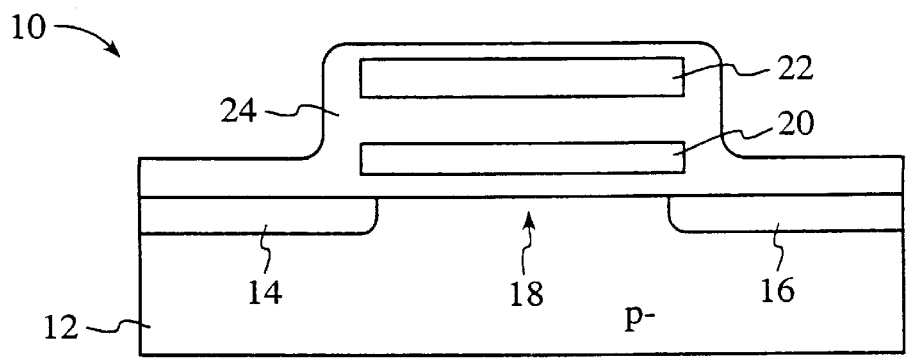
FIG. 1 is a cross-sectional view of a conventional stacked gate EPROM cell.
Figure 2:
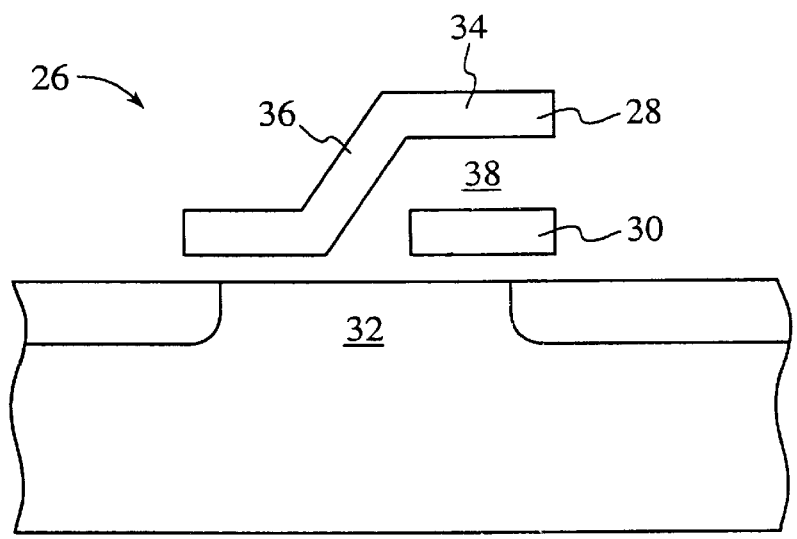
FIG. 2 is a cross-sectional view of a conventional split gate EPROM cell.
Figure 3:
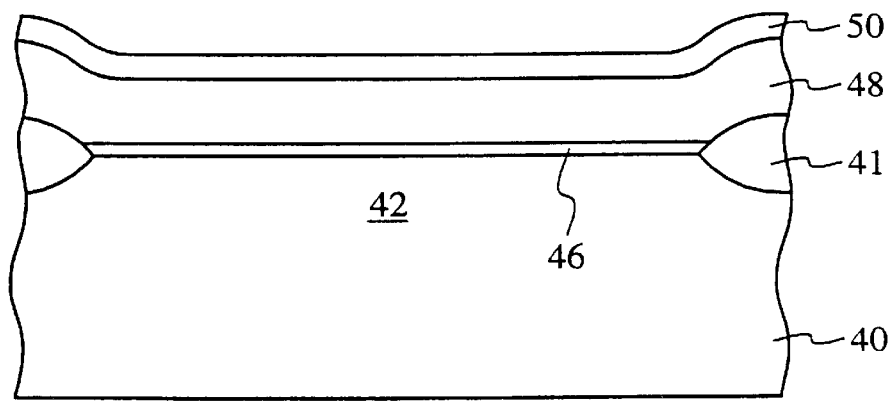
FIGS. 3–8 illustrate a method of forming a flash memory cell according to the present invention.
Figure 4:
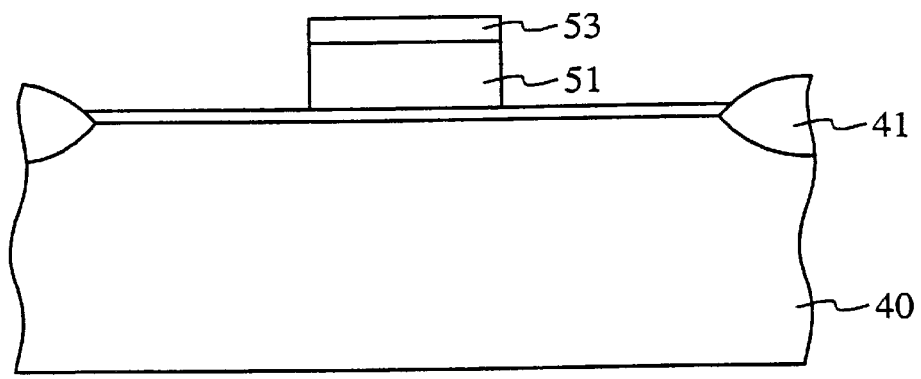

FIGS. 3–8 illustrate a method of forming a flash memory cell according to the present invention. This method is merely an illustration and should not limit the scope of the claims herein. One of ordinary skill in the art would recognize other variations, alternatives, and modifications. Referring to FIG. 3, for example, an improved gate for an EPROM cell in accord with the present invention may be formed on a silicon substrate 40 that is composed of P type doped impurity single crystalline silicon, but can be others. A relatively thick Field OXide (FOX) 41 is formed on and in portions of the substrate surface surrounding and electrically isolating active device area 42 using a LOCal Oxidation of Silicon (LOCOS) method commonly practiced in the semiconductor industry. The LOCOS process includes depositing, or thermally growing, a thin pad oxide (not shown) composed of silicon oxide on the substrate surface and then depositing a silicon nitride ($Si_3N_4$) layer (not shown), usually by chemical vapor deposition (CVD), with the nitride layer serving as a barrier to thermal oxidation. The silicon nitride layer is patterned leaving portions over the silicon substrate where active device regions are required semiconductor devices, such as field effect transistors. The silicon substrate is then subjected to an oxidizing ambient, such as steam oxidation, to form the aforementioned relatively thick field oxide regions composed of silicon dioxide ($SiO_2$) surrounding the active device area 42. The silicon nitride layer is removed by, for example, a hot phosphoric acid solution, and the pad oxide is removed in a dilute solution of hydrofluoric acid (HF) or buffered hydrofluoric acid. Alternatively, trench isolation can be used to form isolation structures in the semiconductor substrate. Trench isolation is commonly formed using techniques of patterning and etching slits or narrowed regions into the substrate. These slits or narrowed regions are then filled with a dielectric material such as silicon dioxide or the like.

A gate dielectric layer 46 is formed overlying the substrate. In a specific embodiment, the gate dielectric layer is made from silicon dioxide by thermal oxidation so as to overlap a portion of each of the active device areas. A stacked gate structure may be formed atop of the gate oxide having a floating gate and a control gate in a flash memory cell. The gate dielectric layer can also be made from silicon oxynitride, silicon nitride, combinations thereof, and the like. Of course, the type of gate dielectric layer used depends upon the application.

The floating gate is constructed from a region of polysilicon 48 formed over the gate dielectric layer 46. The floating gate is made by way of depositing silicon in a polycrystalline or amorphous state. The floating gate polysilicon layer is also known as the poly 1 layer. The gate polysilicon layer is often doped with an N type dopant such as phosphorus and the like. Doping can occur using $POCl_3$ diffusion, in-situ doping techniques, and implantation techniques. The gate polysilicon can be formed in a polycrystalline state or an amorphous state, which is later converted into the polycrystalline state.

A nitride layer 50 is formed overlying the floating gate layer. The nitride layer is made using chemical vapor deposition or the like. The nitride layer is often defined co-extensive with the floating gate layer. Photolithography is used to define the combination of the floating gate layer and the nitride layer. Most generally, techniques such as masking, exposing, developing, and etching are used to define the floating gate electrode patterns, as illustrated by way of FIG. 4. As shown, the gate electrode 51 has substantially vertical edges or "sidewalls" made by way of anisotropic etching, but is not limited to these types of edges. The nitride layer is defined overlying the gate electrode. The nitride layer 53 is commonly termed a "cap" nitride layer.

Alternatively, a dielectric layer is formed overlying the floating gate layer. This dielectric layer can be a single layer or multiple layers, e.g., oxide on nitride on oxide, commonly termed ONO. Using for example an ONO dielectric layer, oxide is formed using a thermal annealing step of steam oxidation to form high quality substantially pinhole free oxide. The nitride layer is formed using a thermal treatment process also. A subsequent oxide layer overlying the nitride layer can be formed using thermal treatment by way of steam oxidation or the like. Of course, the technique used depends upon the application.

Figure 5:
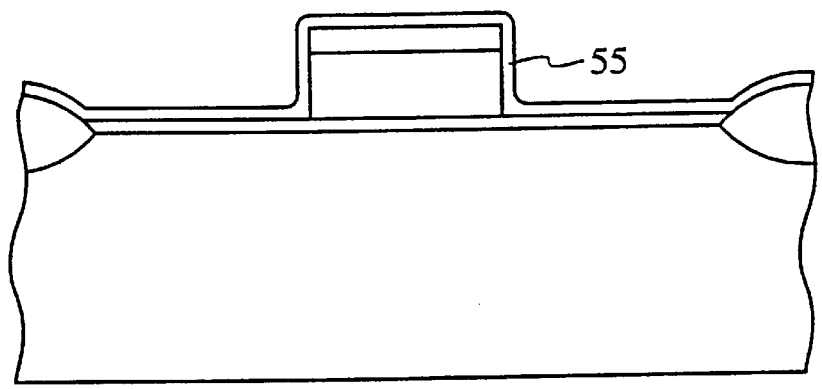

Selected layers are defined overlying the gate electrode and the cap nitride layer to define sidewall spacers on edges of the gate electrode, as shown by FIG. 5. A first dielectric layer 55 is defined overlying the edges of the gate electrode and the cap nitride layer. The first dielectric layer can be any highly uniform and substantially pinhole free layer. As merely an example, the first dielectric layer is made using a thermal oxide or steam oxidation process. Preferably, the first dielectric layer is a relatively high temperature oxide, which is deposited by chemical vapor deposition. An example of this high temperature oxide uses a $SiH_2Cl_2$ compound, which is deposited using high temperature chemical deposition techniques. The thermal oxide layer often has a uniformity ranging from about ±12% to about ±5%. The first dielectric layer seals or isolates the gate electrode from overlying integrated circuit elements.

Figure 6:
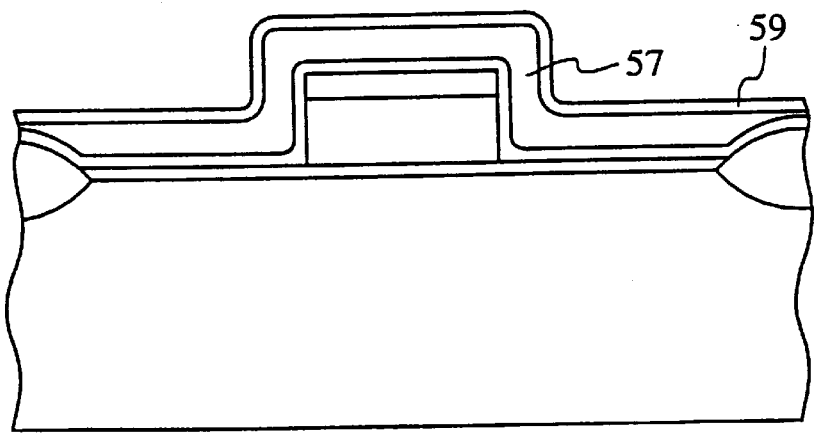

A silicon layer 57 is defined overlying the first dielectric layer, as shown by FIG. 6. The silicon layer is highly uniform and is substantially free from hillocks and pinholes. In a specific embodiment, the silicon layer is deposited as an amorphous silicon layer. This amorphous silicon layer is often made by way of a chemical vapor deposition technique at temperatures less than about 550 degrees Celsius. The amorphous silicon layer is highly uniform and has a uniformity value ranging from about ±2% to about ±5%. The amorphous silicon layer can be doped or undoped. The doped amorphous silicon layer can be in-situ doped, as well as doped by way of diffusion or implantation. An impurity such as $POCl_3$ is often used as a diffusion source. Another source of impurity can be $PCl_3$ or the like. The amorphous silicon layer can be laid down more uniformly than conventional dielectric films.

A dielectric layer 59 is defined overlying the silicon layer. The dielectric layer can be any suitable material such as silicon dioxide or the like. Silicon dioxide is often made by way of thermal or steam oxidation of the silicon layer. Steam oxidation forms a relatively dense layer, which is high quality and substantially free from pinholes. This dielectric layer will act as a mask during a subsequent etching process to define the sidewall spacers. A thickness of this silicon dioxide layer ranges from about 50 Å to about 300 Å and less.

Figure 7:
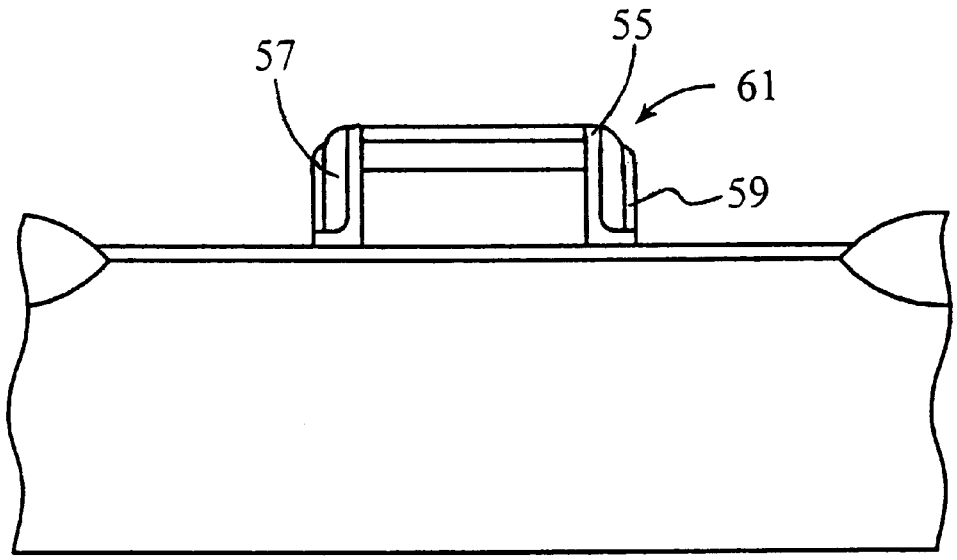

Plasma etching forms the sidewall spacers 61 on edges of the gate electrode, as illustrated by FIG. 7. In particular, plasma etching removes horizontal portions of the silicon layer and dielectric layer, while leaving vertical portions of such layers substantially intact. The vertical portions of these layers, which are defined on the edges of the gate electrode, form the sidewall spacers. The spacers are each substantially uniform in thickness. In fact, the spacer thickness ranges from about 200 Å to about 500 Å, and less. The tolerance or accuracy of the spacers is each about 50 Å and less. Of course, spacer thickness depends highly upon the application.

Figure 8:
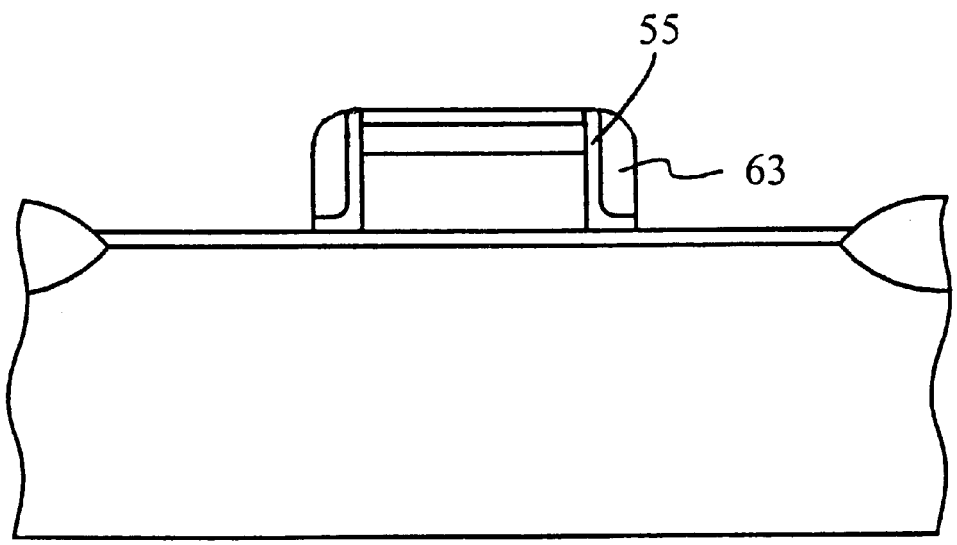

In some embodiments, the sidewall spacers, including the silicon layer, are converted into an insulating or dielectric structure, as illustrated by FIG. 8. A step of thermal oxidation converts the silicon spacers 63 into silicon dioxide. This thermal oxidation step occurs at a temperature of about 850° C. and less. Thermal oxidation also occurs in a wet steam or oxygen environment, but is not limited to this. A substantially completed sidewall spacer structure includes sidewall spacers made of silicon dioxide, which is defined on edges of the gate electrode.

The present invention achieves substantially uniform sidewall spacers, which were commonly difficult if not impossible to achieve by way of conventional techniques. In particular, the present invention uses a highly accurate chemical vapor deposition technique for forming sidewall spacers made of amorphous silicon or polycrystalline silicon. The spacers are converted using a thermal process (e.g., annealing) to change the silicon into silicon dioxide, which is an insulating layer. By way of the silicon spacer, the present invention provides a more uniform spacer, than conventional techniques.

Additional fabrication processes are performed. A control gate layer is defined overlying one of the dielectric layers to form a sandwiched gate structure. The control gate layer is preferably a polysilicon layer. The polysilicon layer is generally doped with impurities such as an N-type impurity. The N-type impurity is diffused, implanted, or in-situ doped. In most cases, it is desirable to in-situ dope the impurity into the control gate layer to prevent any possible damage to the dielectric layer. An example of an N-type impurity is phosphorus, arsenic, and others. Alternatively, a lower temperature diffusion process may be used to introduce impurities into the control gate layer.

In addition to those steps described above, lightly doped drain ("LDD") implants are made to form N-type and P-type LDD regions. A mask typically of photoresist overlying the top surface of the substrate exposes regions for the N-type LDD implant. The N-type implant forms the N-type LDD regions for an N type channel device. The mask is then stripped by way of standard techniques in the art. Another mask exposes P-type LDD regions for the P-type LDD implant. The P-type implant forms the P-type LDD regions for a P type channel device. The mask is stripped. Source/drain regions are defined in the memory device. An N+type implant is made to define source/drain regions of the N-type impurity device. A P+type implant is made to define source/drain regions of the P-type impurity device. To complete the cell structure, the method undergoes steps of applying an inter-dielectric film overlying the surface region of the memory device. Contact regions or vias are made in the inter-dielectric film. Remaining fabrications steps are performed to complete the device.

Figure 9:
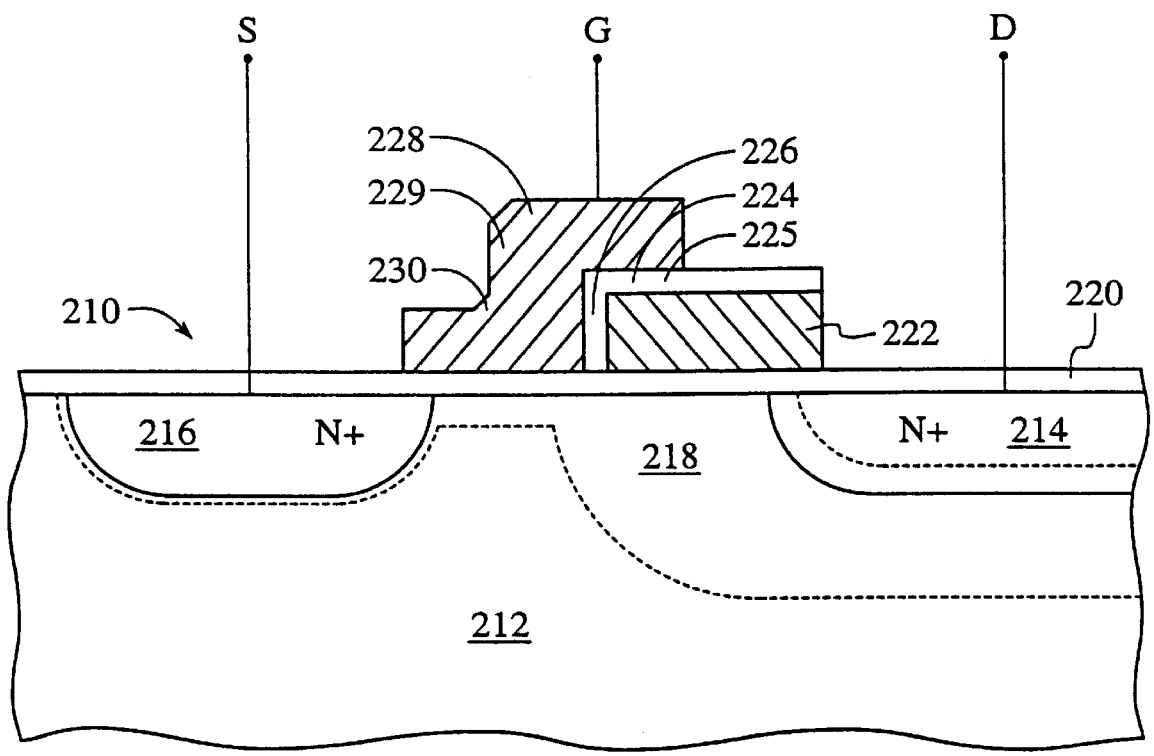
FIG. 9 is a cross-sectional view of a split gate storage transistor formed according to the method discussed above with respect to FIGS. 3–8.

FIG. 9 shows a single transistor non-volatile electrically alterable semiconductor memory storage transistor 210 according to a specific embodiment of the present invention. The storage transistor 210 comprises a semiconductor substrate 212, such as silicon. The substrate 212, in one embodiment, can be a P-type silicon substrate with a typical doping level range from 5 to 50 ohm-cm, depending on the level of scaling. Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 Å of thickness.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225, formed in accordance with the method discussed above with respect to FIGS. 3–8, has a first portion 224 disposed over the floating gate 222 and a second portion 226 disposed adjacent to the floating gate 222. The first portion 224 (top wall 224) of the second layer 225 is 1000–3000 Å thick and second portion 226 (side wall 226) is 150–1200 Å thick. A control gate 229 has two portions: A first portion 228 is disposed over the top wall 224 of the second layer 225; a second portion 230 is disposed over the first layer 220 and is immediately adjacent to the side wall 226 of the second layer 225. The second portion 230 of the control gate 229 extends over a portion of the source region 216 and over a portion of the channel region 218.

The dimensions of the storage transistor 210 depend upon the process used. Thus, the foregoing dimensions for the first layer 220, side wall 226, and top wall 224 are only illustrative examples. Further, the material, for the first layer 220 and the second layer 225 are also illustrative examples only. In general, however, the dimensions of the storage transistor 210 are such that electrons emanating from the source region 216 are injected onto the floating gate 222 by sensing an abrupt potential drop. Further, the dimensions of storage transistor 210 are such that charges from the floating gate 222 are removed by tunneling through the Fowler-Nordheim mechanism through, for example, the second layer 225 onto the control gate 229. The particular manner of operating the storage transistor 210 is as follows:

Initially, when it is desired to erase storage transistor 210, a ground potential is applied to the drain 214 and to the source 216. A high-positive voltage, on the order of, e.g., +15 volts, is applied to the control gate 229. Charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level in the vicinity of the threshold voltage of the MOS structure defined by the control gate 229, (on the order of approximately +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the storage transistor 210 is sensed to be programmed at the "0" state.

Figure 10:
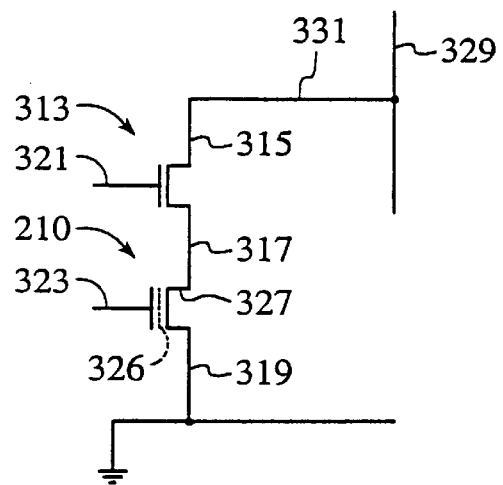
FIG. 10 is a schematic diagram of a memory cell in accordance with an alternate embodiment.

Referring to FIG. 10, a schematic circuit diagram of a memory cell according to another specific embodiment of the present invention is shown including a storage transistor 310 and a field effect transistor 313 to allow selection of memory device 311 from among other memory cells. A drain 315 of selection transistor 313 is connected via a metal contact 331 to a read line 329. Selection transistor 313 and storage transistor 310 are connected together in series at a node 317 which serves as both a source for selection transistor 313 and a drain for storage transistor 310. A source 319 of storage transistor 310 connects to a common source line which in turn is coupled to ground. The gate 321 of selection transistor 313 is electrically connected to a word select line. The control gate 323 of storage transistor 310 is connected to a sense enable and program line. The circuit of FIG. 10 also includes in the storage transistor 310 a floating gate 326 (as represented in FIG. 10 by a dashed line), separated from the substrate by only a thin oxide layer. A program and erase implant 327 is provided in storage transistor 310 proximate to the device 317. The thin oxide layer together with the program and erase implant 327 permit rapid erasure of storage transistor 310 electrically in a few milliseconds, instead of the usual twenty minutes or so with UV light with the thicker oxide layer under the floating gate of prior memory devices. The implant 327 also enables more efficient reprogramming to occur.

Figure 11:
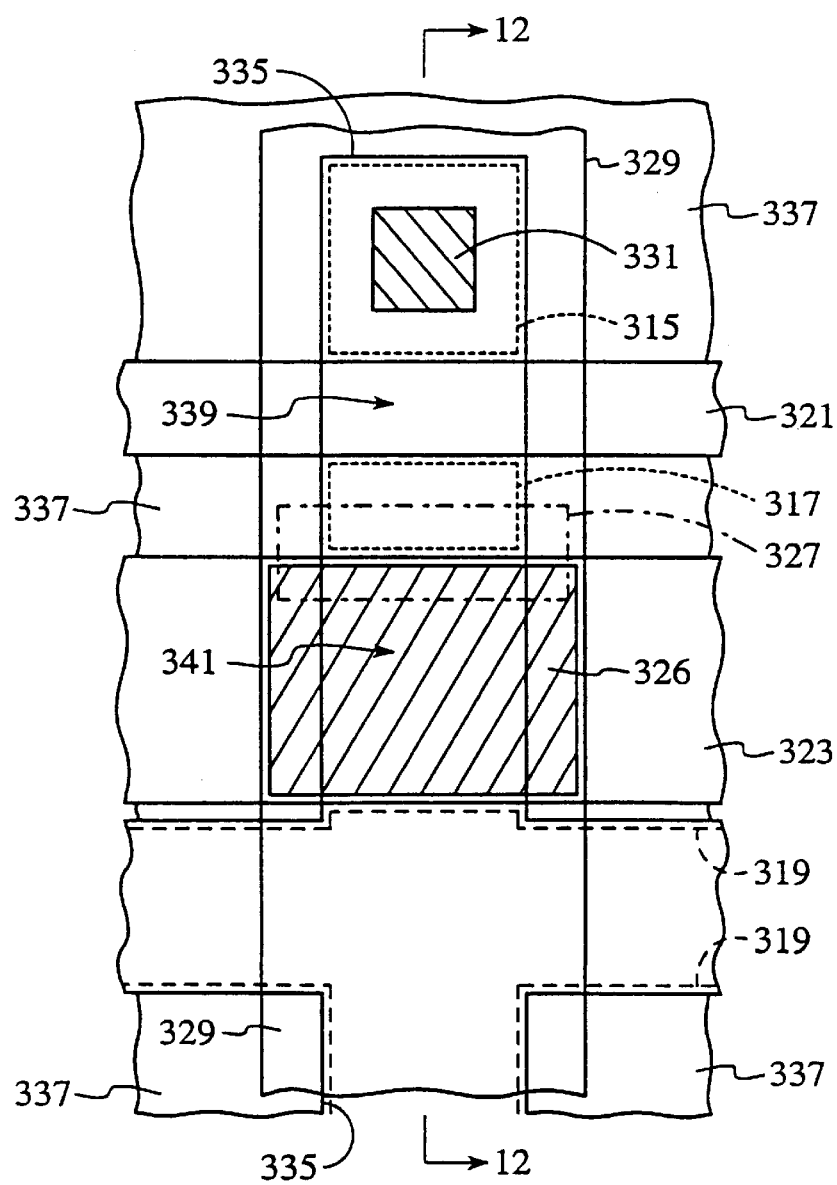
FIG. 11 is a top plan view of the memory cell shown in FIG. 10.
Figure 12:
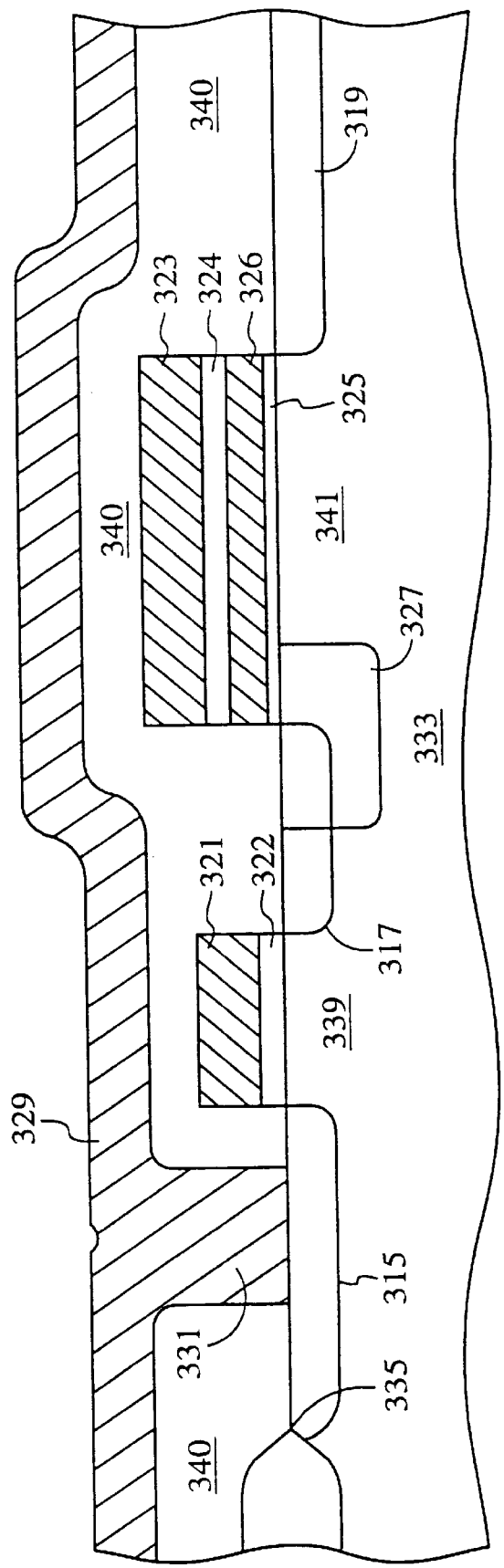
FIG. 12 is a side sectional view of the memory cell shown in FIG. 11, taken along the line 12—12.

FIG. 11 is a top plan view of the memory cell of FIG. 10. FIG. 12 is a side sectional view taken along the line 12—12 in FIG. 11. With reference to FIGS. 11 and 12, a semiconductor chip having an array of memory cells comprises a semiconductor substrate 333 with active memory areas 335 therein. A field isolation oxide layer 337 is present over all nonactive areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 7. Implant 317 forms a node functioning as both a source for selection transistor 313 and a drain for storage transistor 310 in FIG. 10. Implant 319 forms a source for storage transistor 310. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the storage transistor 310. Implant 327 is typically N-type and may be formed by either phosphorus or arsenic ion implantation followed by diffusion, as explained below. A thin oxide layer 325 is disposed over channel 341 between implants 317 and 319, including over the portion of program and erase implant 327 which extends into channel 341, in active area 335. Typically, thin oxide layer 325 is between 70 Å and 150 Å thick. The remainder of active area 335 between field oxide layer 337 has an oxide layer 322 over it. Oxide layer 322 is thicker than thin oxide layer 325, typically about 300–500 Angstrom thick.

A polysilicon floating gate 326 is disposed on thin oxide layer 325 and extends over that portion of program and erase implant 327 that is beneath thin oxide layer 325. An interpoly oxide layer 324 is disposed on floating gate 326 and a polysilicon sense gate 323 is situated above interpoly oxide layer 324. A polysilicon select gate 321 is disposed above oxide layer 322 which overlies channel 339 between implants 315 and 317. A spacer (not shown) may be formed surrounding both the polysilicon select gate 321 and the oxide layer 322 in the manner described above with respect to FIGS. 1–8. Similarly, a spacer (not shown) may be formed surrounding the polysilicon sense gate 323, the interpoly oxide layer 324 and the floating gate 326. The entire wafer is covered with an insulating glass layer 339 with vias for contacts 331 therein. A layer of conductive lines 329 is disposed on top of glass layer 340.

Figure 13:
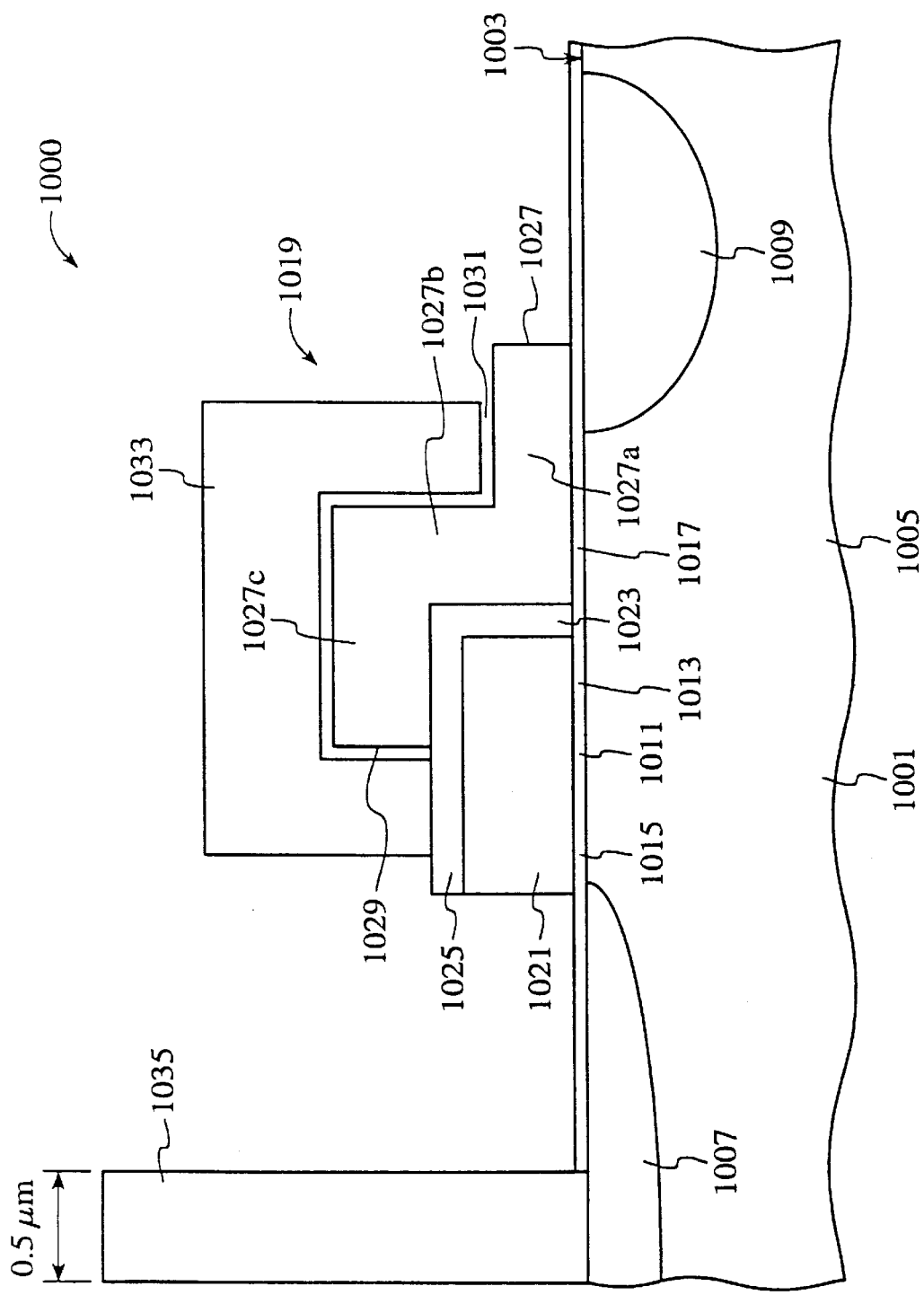
FIG. 13 is a flash memory cell employing a storage transistor formed according to the method discussed above with respect to FIGS. 3–8.

In a specific embodiment, the present invention can be applied to an improved flash memory cell 1000, such as the one shown in the simplified diagram of the FIG. 13. In this manner, the memory cell 1000 would be surrounded by a spacer (not shown) formed in accordance with the method discussed above with respect to FIG. 1–8. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a POCl$_3$ compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g., control gate, floating gate. The select gate also has a channel region ranging from about 0.2 microns and less or about 1.0 microns and less, but is not limited to these ranges. Additionally, the select gate has a thickness of about 500 Å and less and about 3500 Å and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge 1029 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. The dielectric layer insulates and isolates the floating gate from a control gate 1033. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." It is preferred, however, that the dielectric layer be formed employing the method discussed above with respect to FIGS. 3–8. In this fashion, thickness of the dielectric layer may precisely controlled.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 $\mu$m to 0.25 $\mu$m and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

Although the above descriptions have been described in terms of manufacturing a sidewall spacer, the present sidewall spacer technology can be used for a variety of flash memory cells. For example, the present invention can be applied to cells using processes called FETMOX, SIMOS, and others. Additionally, the present invention can be applied to split-gate cell designs. Of course, the type of cell or process used depends upon the application.

The scope of the invention should, therefore, be determined not with reference to the above description, but instead should be determined with reference to the appended claims along with their full scope of equivalents.

What is claimed is:

1. A method of forming an electrically programmable read-only memory (EPROM) cell, said method comprising:

providing a substrate having a dielectric layer thereon;

forming a gate electrode having edges overlying said dielectric layer, said gate electrode having a nitride cap layer thereon;

forming a first oxide layer overlying said nitride cap layer and edges of said gate electrode;

forming an amorphous silicon layer overlying said oxide layer to a selected thickness;

forming a second oxide layer overlying said amorphous silicon layer;

forming sidewall spacers on said edges of said gate electrode from at least said thickness of amorphous silicon and a portion of said second oxide layer, wherein the second oxide layer acts as a width-limiting structure, said width-limiting structure determining at least one dimension of at least one of said sidewall spacers during the formation of the sidewall spacers; and after forming the sidewall spacers, converting said thickness of said amorphous silicon into a dielectric layer comprising silicon.

2. The method as recited in claim 1 wherein said converting comprises thermal annealing.

3. The method as recited in claim 1 wherein said sidewall spacers forming comprises anisotropic etching, said anisotropic etching removing horizontal portions of said amorphous silicon to leave vertical portions of said amorphous silicon in tact on said edges of said gate electrode.

4. The method as recited in claim 1 wherein said first oxide layer is a high temperature oxide.

5. The method as recited in claim 1 wherein said amorphous silicon is a substantially undoped amorphous silicon.

6. The method as recited in claim 1 wherein said amorphous silicon is a substantially doped amorphous silicon.

7. The method as recited in claim 1 wherein said amorphous silicon comprises polycrystalline silicon.

8. The method as recited in claim 1 wherein said dielectric layer is selected from a tunnel oxide, a tunnel oxynitride, or a tunnel nitride.

9. The method as recited in claim 1 wherein said gate electrode has a length of 0.5 micron and less.

10. The method as recited in claim 1 wherein said cap nitride layer is a chemical vapor deposition nitride.

11. The method as in claim 1 wherein at least a portion of said dielectric layer comprising silicon comprises silicon dioxide ($SiO_2$).

12. A method of forming an electrically programmable read-only memory (EPROM) cell, said method comprising:

providing a substrate having a dielectric layer thereon;

forming a gate electrode having edges overlying said dielectric layer, said gate electrode having a nitride cap layer thereon;

forming a first oxide layer overlying said nitride cap layer and edges of said gate electrode;

forming an amorphous silicon layer overlying said oxide layer to a selected thickness;

forming a second oxide layer overlying said amorphous silicon layer;

forming sidewall spacers on said edges of said gate electrode from at least said thickness of amorphous silicon and a portion of said second oxide layer, wherein the portion of the second oxide layer acts as a width-limiting structure, said width-limiting structure operable to determine at least one dimension of at least one of said sidewall spacers during the formation of the sidewall spacers; and thereafter converting said thickness of said amorphous silicon into a dielectric layer comprising silicon.

13. The method of claim 12 wherein said converting comprises converting at least some of said amorphous silicon into silicon dioxide ($SiO_2$).

14. The method as in claim 12 wherein said forming said amorphous silicon layer comprises a chemical vapor deposition process.

15. A method of forming a memory cell, said method comprising:

providing a substrate;

forming a gate electrode disposed above the substrate, wherein the gate electrode has sides;

forming an amorphous silicon layer overlying the gate electrode;

forming a dielectric layer overlying the amorphous silicon layer;

forming sidewall spacers on the sides of the gate electrode from a portion of the amorphous silicon layer and a portion of the dielectric layer, wherein the portion of the dielectric layer acts as a width-limiting structure, said width-limiting structure defining at least one dimension of at least one of said sidewall spacers during the formation of the sidewall spacers; and converting the portion of the amorphous silicon layer and the portion of the dielectric layer comprising the sidewall spacers into a dielectric comprising silicon.

* * * * *